United States Patent [19]

Coquin et al.

[11] 4,400,235
[45] Aug. 23, 1983

[54] ETCHING APPARATUS AND METHOD

[75] Inventors: Gerald A. Coquin, New Providence; Joseph M. Moran, Berkeley Heights; Gary N. Taylor, Bridgewater, all of N.J.

[73] Assignee: Bell Telephone Laboratories, Incorporated, Murray Hill, N.J.

[21] Appl. No.: 362,045

[22] Filed: Mar. 25, 1982

[51] Int. Cl.³ .................... H01L 21/306; B44C 1/22; C03C 15/00; C03C 25/06
[52] U.S. Cl. .................................. 156/643; 156/345; 156/646; 156/659.1; 204/192 E; 204/298; 430/313
[58] Field of Search ............ 156/643, 646, 345, 659.1; 252/79.1; 204/192 E, 164, 298; 250/531; 430/313, 317; 313/293, 306, 309, 311

[56] References Cited

U.S. PATENT DOCUMENTS 3,984,301 10/1976 Matsuzaki et al. .............. 204/192 E
4,232,110 11/1980 Taylor ................................. 430/313

Primary Examiner—William A. Powell
Attorney, Agent, or Firm—Lucian C. Canepa

[57] ABSTRACT

In a plasma-assisted dry etching process designed to pattern VLSI devices, a relatively high and uniform etch rate exhibiting low contamination is achieved over the entire surface extent of each wafer to be etched. This is accomplished by mounting the wafers in a unique fashion on one of two spaced-apart electrodes in the reaction chamber of a dry etching system. In particular, the front surface of each wafer is maintained in substantially the same plane as that of surrounding dielectric material. Additionally, the thickness of the surrounding dielectric material is designed to be considerably greater than the thickness of any dielectric material in contact with the back surface of each wafer. In that way, the entire front surface extent of each wafer is influenced by a relatively uniform electric field. Moreover, the available field in the chamber is in effect focussed onto the wafer surfaces, thereby achieving a relatively high etch rate characterized by low contamination.

17 Claims, 4 Drawing Figures

ETCHING APPARATUS AND METHOD

BACKGROUND OF THE INVENTION

This invention relates to the fabrication of microminiature structures and, more particularly, to an etching apparatus and to a processing method for making very-large-scale-integrated (VLSI) devices.

Considerable interest exists in employing dry processing techniques for forming patterns in workpieces such as semiconductor wafers. The interest in dry processing stems from its generally better resolution and improved dimensional and shape control capabilities relative to standard wet etching. Thus, dry etching is being utilized increasingly for, for example, fine-line pattern delineation in the processing of semiconductor wafers to form VLSI devices.

Various dry etching processes that involve radio frequency (rf)-generated plasmas in a reaction chamber are known. These so-called plasma-assisted processes include reactive sputter (or ion) etching. In reactive sputter etching, the workpieces to be patterned are placed on the rf-driven cathode electrode in the reaction chamber. In another plasma-assisted process, typically referred to simply as plasma etching, the workpieces are placed on the grounded anode electrode in the reaction chamber. These and other processes suitable for patterning layers in VLSI devices are described by, for example, C. M. Melliar-Smith and C. J. Mogab in "Plasma-Assisted Etching Techniques for Pattern Delineation," *Thin Film Processes*, edited by J. L. Vossen and W. Kern, Academic Press, New York, 1978, pp. 497–552.

In some standard dry etching processes, pattern delineation is achieved by covering selected portions of a layer with a relatively etch-resistant masking pattern. The uncovered portions of the underlying layer to be patterned are then subjected to the etching plasma and thereby removed.

In other dry etching processes, pattern delineation in a negative-tone resist layer is achieved without the use of an overlying masking pattern. Such processes are described, for example, in U.S. Pat. No. 4,232,110, assigned to the same assignee as is the present application, and in a copending commonly assigned U.S. application designated Ser. No. 256,604, filed Apr. 22, 1981 for G. N. Taylor.

In these last-mentioned processes, a film of resist material comprising a host polymer and one or more monomers is selectively irradiated to reduce the mobility of the monomer or monomers in the irradiated regions. This mobility reduction step is referred to as "locking." The film is then fixed, typically by heating, in a vacuum or not, to substantially remove the unlocked monomer from the unirradiated regions. Subsequently, the film is dry etched in a plasma, typically in an oxygen plasma in a reactive sputter etching step. The locked monomer reduces the rate of etching in the irradiated regions relative to that in the unirradiated regions. Accordingly, when the unirradiated regions are etched down to an underlying substrate, a negative resist pattern comprising the irradiated regions remains on the substrate.

Heretofore, plasma-assisted etching processes designed to pattern micron and sub-micron features have often been plagued in practice with a number of problems. Thus, nonuniformity of etching across the surface of the wafer to be patterned often occurs. This results, for example, from the application of nonuniform electric fields to the surface. In particular, nonuniform fields at the edges of the wafer typically cause the etching rate across the surface of the wafer to be nonuniform.

Another obstacle to achieving better results in plasma-assisted dry etching processes has been the seemingly unavoidable presence of contaminants in the reaction chamber of the etching apparatus. These contaminants constitute, for example, material etched away from various surfaces in the reaction chamber in the vicinity of the wafer(s) to be etched. Or they constitute chemical fragments generated in the chamber as a result of field-induced reactions at surfaces in the vicinity of the wafers. Such contaminants can, for example, deposit on the surface of a layer to be etched and thereby effectively inhibit etching of the portions of the layer that underlie the deposited contaminants. As a result, the pattern etched in the contaminated layer may not be a precise reproduction of a prescribed pattern. Or some of these unetched portions, constituting slivers or so-called "grass" regions, may break off or be transported laterally or penetrate subsequent layers during the device fabrication sequence, thereby causing failures in the devices.

Moreover, field-induced reactions at surfaces in the vicinity of the wafers to be etched may so deplete the active etching species in the chamber that the rate of etching the wafer surfaces is deleteriously affected.

For these and other reasons, considerable efforts have been directed by workers in the art aimed at trying to achieve more uniform, more contamination-free and more rapid plasma-assisted dry etching of wafers. It was recognized that such efforts, if successful, would decrease the cost of devices made in accordance with a fabrication sequence that included such an improved etching process.

SUMMARY OF THE INVENTION

Hence, an object of the present invention is to improve plasma-assisted dry etching. More specifically, an object of this invention is an improved etching apparatus and an improved dry processing method for making VLSI devices.

Briefly, these and other objects of the present invention are realized in a specific illustrative embodiment thereof by means of which a wafer to be etched is mounted on one of two spaced-apart electrodes in the reaction chamber of a dry etching system. In particular, the front surface of each wafer is maintained in substantially the same plane as that of surrounding dielectric material. Additionally, the thickness of the surrounding dielectric material is designed to be considerably greater than the thickness of any dielectric material in contact with the back surface of each wafer.

In accordance with applicants' invention, a method for processing a wafer in accordance with an integrated circuit fabrication sequence includes at least one dry etching step in which the wafer is positioned on one of two spaced-apart electrodes in the reaction chamber of an etching system. More specifically, applicants' method comprises mounting the wafer on one of the electrodes to maintain the front surface of the wafer in substantially the same plane as that of surrounding dielectric material, the thickness of the surrounding dielectric material being substantially greater than the thickness of any dielectric material interposed between the back surface of the wafer and the one electrode. A gas is introduced into the chamber. An electric potential is then established between the electrodes to form in the chamber a substantially uniform electric field focussed on the wafer. In that way, the gas is converted into a plasma that contains species that react substantially only with selected portions of the front surface of the wafer. Significantly, the etching reaction thereby occurs in a substantially uniform and contamination-free manner in a relatively rapid way.

BRIEF DESCRIPTION OF THE DRAWING

A complete understanding of the present invention and of the above and other features thereof may be gained from a consideration of the following detailed description presented hereinbelow in connection with the accompanying drawing, in which.

DETAILED DESCRIPTION

Herein, for purposes of a specific illustrative example, emphasis will be directed to processes and equipment that utilize reactive gas plasmas in a mode wherein chemical reactions are enhanced by charged particle bombardment of workpieces mounted on the driven cathode in the reaction chamber of an etching system. Such a system is adapted to carry out reactive sputter (or ion) etching, as is well known in the art.

Reactive sputter etching may be carried out, for example, in a conventional parallel-plate reactor of the particular type depicted in FIG. 1 and described later below. Or etching may be carried out in other known systems, such as the high-throughput multifaceted system described in commonly assigned U.S. Pat. No. 4,298,443. Applicants' inventive apparatus and method are applicable to and may be embodied in any of these or similar etching systems.

Moreover, illustrative emphasis herein will be directed to utilizing applicants' invention for etching semiconductor wafers to fabricate VLSI devices. But, of course, the invention is also applicable to the manufacture of other solid state devices, including magnetic bubble devices, lightwave devices, etc. And, further, applicants' invention may obviously additionally be employed to hold and to process a member that is to be patterned to form a mask structure. Such a mask structure is subsequently utilized to selectively irradiate a resist-coated wafer in which devices are to be delineated.

Furthermore, since applicants have determined that their herein-described invention is particularly advantageous when applied to the patterning of the aforespecified dry-developed negative-tone resist materials, specific, but only illustrative, emphasis herein will be directed to etching such materials which have been selectively irradiated by photo, electron, ion or X-ray lithography. As indicated above, etching or dry developing of these materials is carried out without the use of an overlying masking pattern.

Figure 1:
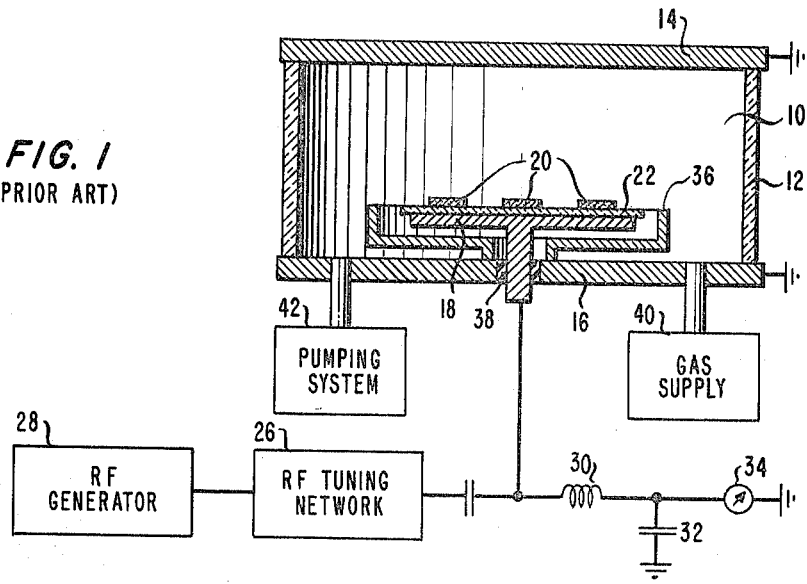
FIG. 1 is a simplified schematic representation of a conventional dry etching system of a type known in the art.

A particular conventional parallel-plate reactor suitable for carrying out reactive sputter etching is shown in FIG. 1. The depicted reactor comprises an etching chamber 10 defined by a cylindrical member 12 and two conductive end plates 14 and 16. In addition, the reactor includes a conductive electrode 18. The grounded plate 14 constitutes the other electrode of the depicted system.

Workpieces 20 (FIG. 1), for example semiconductor wafers whose top surfaces are to be etched, rest on a plate 22 made of a dielectric material. In turn, the dielectric plate 22 is positioned on the electrode 18. In one illustrative case, the top of the plate 22 constitutes a 10-inch circular surface designed to have seven 3-inch wafers placed thereon.

The electrode 18 shown in FIG. 1 is capacitively coupled via a radio-frequency tuning network 26 to an rf generator 28 which, by way of example, is designed to drive the electrode 18 at a frequency of 13.56 megahertz. Further, the electrode 18 is connected through a filter network, comprising an inductor 30 and a capacitor 32, to a meter 34 that indicates a direct-current voltage that approximates the peak value of the rf voltage applied to the electrode 18.

In the standard FIG. 1 etching system, the grounded top plate 14 constitutes the anode of the depicted reactor. The electrode 18 is the driven cathode of the system. In one specific illustrative reactor of the type shown in FIG. 1, the anode-to-cathode separation was approximately 8 inches and the diameter of the anode plate was approximately 17 inches.

The end plate 16 of the FIG. 1 arrangement is also connected to ground. Additionally, an open-ended cylindrical shield 36 surrounding the electrode 18 is connected to the plate 16 and thus to ground. The portion of the holder 18 that extends through the plate 16 is electrically insulated therefrom by a nonconductive bushing 38.

A specified gas or mixture of gases utilized for dry etching is controlled to flow into the indicated chamber from a standard supply 40. Additionally, a prescribed low-pressure condition is maintained in the chamber 10 by means of a conventional high-vacuum pumping system 42.

By introducing a suitable gas or gas mixture into the chamber 10 of FIG. 1 and establishing an electrical field between the anode 14 and the cathode 18, a reactive plasma is generated in the chamber. The plasma established therein is characterized by a dark space in the immediate vicinity of the workpiece surfaces to be etched. Volatile products formed at the workpiece surfaces during the etching process are exhausted from the chamber by the system 42.

In actual operation, wafer-holding apparatus of the type shown in FIG. 1 exhibits nonuniformity of etching across the top surfaces of the wafers 20. In particular, this arises at least in part from the fact that the applied electric field at and near the edges of the wafers is different in strength and configuration from the field applied to more central portions of the wafer surfaces.

Moreover, the FIG. 1 arrangement is generally characterized by relatively substantial field-induced reactions in the vicinity of the wafers to be etched. In particular, such reactions occur on the top surface of the dielectric plate 22. These reactions typically introduce contaminants into the etching process and, further, often so deplete the active etching species as to deleteriously affect the rate at which the wafer surfaces are etched.

Figure 2:
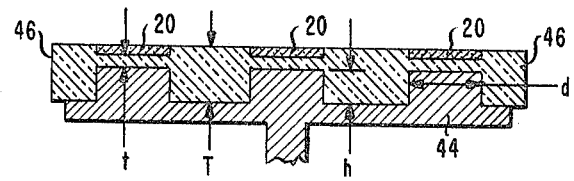
FIG. 2 shows a specific illustrative wafer-holding apparatus made in accordance with the principles of the present invention for inclusion, for example, in the FIG. 1 system.

FIG. 2 shows a specific illustrative wafer-holding apparatus made in accordance with the principles of the present invention. The depicted apparatus (not drawn to scale) is adapted to be included in one of the previously specified dry etching systems.

Disposed on conductive electrode 44 of FIG. 2 is a dielectric member 46. In turn, wafers 20 whose top surfaces are to be etched are positioned in recesses formed in the top surface of the member 46. Each such recess is only slightly larger in diameter than that of the wafer to be placed therein. Additionally, each recess has a depth that closely approximates the thickness of its associated wafer.

Significantly, the recesses shown in FIG. 2 are formed such that the top surfaces of the wafers 20 lie approximately in the same plane as the top main surface of the member 46. As a result, the strength and configuration of the applied electric field at and near the peripheral edges of the wafers 20 are in practice thereby established to be substantially the same as the strength and configuration of the field applied to interior portions of the wafer surfaces. The consequence of this substantially uniform field is that substantially uniform field-assisted etching thereby occurs across the entire top surface of each wafer.

Additionally, the apparatus shown in FIG. 2 is effective to substantially concentrate or focus the applied electric field onto the surfaces of the wafers 20. This is accomplished in practice by insuring that the thickness of the dielectric material interposed between each wafer and an immediately underlying portion of the electrode 44 is considerably less than that of adjacent full-thickness regions of the dielectric member 46. By designing the electrode 44 to include an elevated post directly beneath and comparable in cross-section with each wafer-holding recess, the specified disparity in dielectric thickness is thereby achieved.

In one specific illustrative embodiment of FIG. 2 designed to accommodate 3-inch-diameter wafers, the thickness t of the dielectric member 46 immediately below each wafer 20 is approximately only 60 mils whereas the full thickness T of the member 46 is about 0.5 inches. In that specific embodiment, each of the electrode posts shown in FIG. 2 constitutes a cylinder having a diameter d of about 3 inches and a height h of approximately 0.42 inches.

Illustratively, the dielectric member 46 of FIG. 2 is made of a high-temperature-tolerant organic polymer, such as plexiglas or a poly(arylate) such as Ardel. [A number of poly(arlyate) polymers, including Ardel, are described in a commonly assigned copending application of J. M. Moran, designated Ser. No. 295,839, filed Aug. 24, 1981.] Other suitable materials for the member 46 include a poly(carbonate) such as Lexan or a polyimide such as Kapton.

Figure 3:
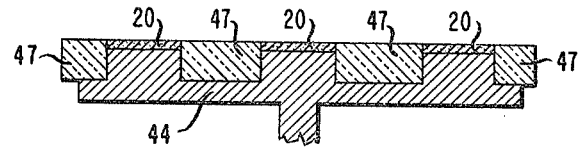
FIGS. 3 and 4 respectively depict other specific illustrative wafer-holding arrangements that embody the principles of applicants' invention and are advantageous for carrying out dry etching in an integrated circuit fabrication process.

An alternative specific illustrative embodiment of applicants' invention is depicted in FIG. 3. In FIG. 3, the wafers 20 and the electrode 44 may be identical to the correspondingly numbered elements in FIG. 2. But, in FIG. 3, the bottom surfaces of the wafers 20 are in direct electrical and thermal contact with the top surfaces of the post portions of the electrode 44. Hence, dielectric member 47 of FIG. 3 includes apertures therethrough in respective alignment with the depicted posts of the electrode 44. These apertures have approximately the same cross-section (slightly larger in size) than the wafers to be placed therein.

In the FIG. 3 embodiment, wherein the wafers 20 directly contact post portions of the electrode 44, thermal cooling of the wafers is facilitated. In addition, in that embodiment a substantial portion of the applied field is directed in a particularly focussed or concentrated way onto the surfaces of the wafers to be etched. As a result, the etching rate is thereby enhanced.

Furthermore, the FIG. 3 embodiment satisfies the requirement that, for some etching applications of practical importance, the bottom surfaces of the workpieces must be in direct electrical contact with the cathode electrode to achieve anisotropic etching. This is required, for example, when anisotropically patterning doped polysilicon in a chlorine plasma in a reactive sputter etching process, as described in a commonly assigned copending application of D. Maydan and D. N. Wang, designated Ser. No. 300,307, filed Sept. 8, 1981.

In FIG. 3, the existence of excessive gaps between the edges of the wafers 20 and the facing walls of the apertures in the dielectric member 47 may give rise in practice to arcing of the plasma to the top of the electrode posts. To minimize the likelihood of this occurring, it is sometimes advantageous to make the cross-sectional area of the posts smaller than that of the overlying wafers. Such an alternative arrangement is illustrated in FIG. 4.

Figure 4:
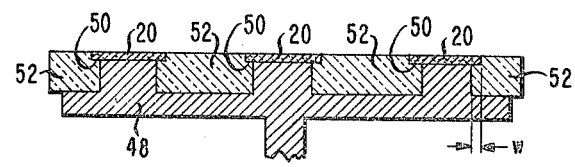

As indicated in FIG. 4, a major central portion of the bottom surface of each wafer 20 rests directly on an associated post of electrode 48. Illustratively, the peripheral portion of the bottom surface of each wafer overhangs its associated post electrode and is in practice usually separated from a ledge portion 50 of dielectric member 52 by a distance of 10-to-20 mils. (In one specific embodiment, the width w of the portion 50 was about 0.1 inches.) In that way, the likelihood of any field lines "seeing" the conductive posts is substantially reduced. Arcing of the plasma to the electrode 48 is, therefore, practically eliminated.

As indicated earlier above, applicants' invention is particularly advantageous in practice when applied to the etching (developing) of the aforespecified dry-developed negative-tone resist materials. More specifically, an illustrative such material comprises 7.5 percent by weight bis-acryloxybutyltetramethyldisiloxane in a 92.5 percent by weight host polymer of poly(2,3-dichloro-1-propyl acrylate). Such a material coated on a wafer is, illustratively, selectively irradiated by $Pd_{L\alpha}$ X-radiation at a wavelength of 4.37 Angstroms at a dose of 1.5 millijoules per square centimeter. Subsequently, the fixing of such an irradiated coating is accomplished by, for example, heating the coating to 70 degrees Celsius under a vacuum of 0.5 Torr for about 1 hour. Development or etching of the coating is then carried out in applicants' herein-specified apparatus in, by way of a specific example, an oxygen plasma in a reactive sputter etching step at a pressure in the range 5-to-50 milliTorr at a power density of about 0.1-to-0.5 watts per square centimeter for about 5-to-10 minutes.

Finally, it is to be understood that the above-described specific embodiments and procedures are only illustrative of the principles of the present invention. In accordance with these principles, numerous modifications and alternatives may be devised by those skilled in the art without departing from the spirit and scope of the invention.

What is claimed is:

1. Apparatus for etching the front surfaces of workpieces, said apparatus comprising
a reaction chamber having spaced-apart conductive electrodes therein,
means for establishing an electric field between said electrodes,
means for introducing a gas into said chamber into the space between said electrodes,
and means for mounting said workpieces on one of said electrodes to establish a substantially uniform and focussed electric field across the surfaces of said workpieces during etching,
wherein said one electrode includes post regions disposed in respective alignment with said workpieces to be etched,
and wherein a dielectric member formed to surround the sides of said post regions is positioned on said one electrode to cover all but the post regions of said one electrode with a relatively thick layer of dielectric material, said member having a main planar surface and being formed to permit said workpieces to be respectively mounted in alignment with said post regions with the front surfaces of said workpieces in the same plane as that of said main surface and with the thickness of any dielectric material interposed between the back surfaces of said workpieces and said post regions being relatively thin.

2. Apparatus as in claim 1 wherein the area of said one electrode is less than that of the other electrode and said one electrode constitutes the cathode electrode of a reactive sputter etching system.

3. Apparatus as in claim 2 wherein the dielectric member contains apertures therethrough to permit the back surfaces of said workpieces to be mounted directly in contact with said post regions.

4. Apparatus as in claim 3 wherein said establishing means comprises electrical connections extending from said electrodes to the exterior of said apparatus, said connections being adapted to be capacitively coupled to a radio-frequency source.

5. Apparatus as in claim 4 wherein said introducing means comprises an inlet port and tubing to carry gas from an external supply into said chamber.

6. Apparatus for etching the front surfaces of plural workpieces, said apparatus comprising
a reaction chamber,
two spaced-apart electrodes in said chamber, one of said electrodes having a planar base portion with post regions thereon,
a dielectric plate member in contact with said base portion and encompassing said post regions, said plate member including a planar front surface having at least workpiece-sized portions removed therefrom in respective alignment with said post regions for mounting said workpieces such that the front surfaces of said workpieces lie in the same plane as the front surface of said plate member.

7. Apparatus as in claim 6 wherein said portions each constitute workpiece-high recesses formed in said plate member, each such recess having substantially the same cross-sectional area as that of its associated workpiece.

8. Apparatus as in claim 6 wherein said portions each constitute a through aperture having substantially the same cross-sectional area as that of its associated post region and workpiece.

9. Apparatus as in claim 6 wherein said portions each constitute a through aperture and the cross-sectional area of each post region is slightly less than that of its associated workpiece, each such aperture including a relatively small cross-sectional area portion closely encompassing its associated post region and a relatively large cross-sectional area workpiece-high portion whose cross-sectional area closely approximates that of the workpiece to be placed therein.

10. A method of making a device by processing a workpiece in accordance with a fabrication sequence that includes at least one dry etching step in which the workpiece is positioned on one of two spaced-apart electrodes in the reaction chamber of an etching system, said one electrode having a planar base portion with a post region thereon, said method comprising
mounting said workpiece on said one electrode overlying said post region and in registry therewith to maintain the front surface of said workpiece in substantially the same plane as that of surrounding dielectric material disposed on said one electrode, the thickness of said surrounding dielectric material being substantially greater than the thickness of any dielectric material interposed between the back surface of said workpiece and said post region,
introducing a gas into said chamber, and
establishing an electric potential between said electrodes to form in said chamber a substantially uniform electric field focussed on said workpiece thereby to convert said gas into a plasma that contains species effective to react with selected portions of said front surface in a substantially uniform and contamination-free manner to etch said portions in a relatively rapid way.

11. A method as in claim 10 wherein said etching is carried out in a reactive sputter etching step in which said workpiece is mounted on the cathode electrode in said chamber.

12. A method as in claim 11 wherein said workpiece includes thereon a selectively irradiated layer of a dry-developed negative-tone resist material.

13. A method as in claim 12 wherein the gas introduced into said chamber comprises oxygen.

14. A method as in claim 13 wherein said resist material comprises 7.5 percent by weight bis-acryloxybutyl-tetramethyldisiloxane in a 92.5 percent by weight host polymer of poly(2,3-dichloro-1-propyl acrylate).

15. A method as in claim 14 wherein said resist material is selectively irradiated by X-radiation in a lithographic processing step.

16. A method as in claim 15 wherein said selectively irradiated layer is fixed by heating to approximately 70 degrees Celsius under a vacuum of about 0.5 Torr for about 1 hour.

17. A method as in claim 16 wherein etching of said fixed layer is carried out at a pressure in the range 5-to-50 milliTorr at a power density of about 0.1-to-0.5 watts per square centimeter for about 5-to-10 minutes.

* * * * *